US006167242A

United States Patent [19]
Henderson et al.

[11] Patent Number: 6,167,242
[45] Date of Patent: Dec. 26, 2000

[54] OFFSET VOLTAGE CANCELLATION SYSTEM FOR RADIO FREQUENCY POWER CONTROLLERS

[75] Inventors: Edward L. Henderson, Atkinson, N.H.; David B. Bell, Los Altos, Calif.

[73] Assignee: Linear Technology Corporation, Milpitas, Calif.

[21] Appl. No.: 09/298,345

[22] Filed: Apr. 23, 1999

[51] Int. Cl.[7] .................................................. H04B 1/04
[52] U.S. Cl. ......................... 455/126; 455/127; 330/291; 375/297
[58] Field of Search .................................. 455/126, 127, 455/63, 114, 296, 311; 375/296, 297; 330/291

[56] References Cited

U.S. PATENT DOCUMENTS

| | | | |
|---|---|---|---|
| 4,042,885 | 8/1977 | Rhodes, Jr. | 330/9 |
| 4,553,052 | 11/1985 | Takahashi | 307/494 |

OTHER PUBLICATIONS

"PCF5078: Power amplifier controller for GSM and PCN systems," Philips Semiconductors Data Sheet, Product Specification, Apr. 12, 1999, pp. 1–19.
"AD8307: Low Cost DC–500 MHz, 92 dB Logarithmic Amplifier," Analog Devices, REV. A, 1999, pp. 1–20.
"AD8309: 5 MHz–500 MHz 100 dB Demodulating Logarithmic Amplifier with Limiter Output," Analog Devices, REV. A, 1999, pp. 1–20.
"AD8313: 0.1 GHz–2.5 GHz, 70 dB Logarithmic Detector/ Controller," Analog Devices, REV. A, 1999, pp. 1–16.
"AD8306: 5 MHz–400 MHz 100 dB High Precision Limiting–Logarithmic Amplifier," Analog Devices, REV. 0, 1999, pp. 1–16.
"AD641: 250 MHz Demodulating Logarithmic Amplifier," Analog Devices, REV. B, 1999, pp. 1–16.
"SiGe Front–End RFICs," Microwave Journal, Dec. 1998, pp. 114–116.
"A 0.1 to 2.5 GHz Logarithmic Amplifier for RF Detection," Microwave Journal, Jul. 1998, pp. 142–145.
"PCF5077T: Power amplifier controller for GSM and PCN systems," Philips Semiconductors Data Sheet, Preliminary Specification, Nov. 19, 1997, pp. 1–23.
Williams, Mark et al., "Technique Provides Burst Control in GSM Power Amplifiers," Microwaves & RF, Jul. 1997, pp. 70–78.
Raymond W. Waugh, "Designing Large–Signal Detectors for Handsets and Base Stations," Wireless Systems Design, Jul. 1997, pp. 42–48.
"Driver Amplifier Provides Wide Gain–Control Range," Microwaves & RF, Feb. 1997, p. 140.
"LTC1409: 12–Bit, 800ksps Sampling A/D Converter with Shutdown," 1997 Linear Technology Databook, vol. VI, pp. 6–65–6–84.
Lindberg, Craig et al., "Simplify Bias Voltage Circuits for GaAs Power Amps," Microwaves & RF, Dec. 1995, pp. 155–160.
"PCF5075: Power amplifier controller for GSM and PCN systems," Philips Semiconductors Preliminary Specification, Jul. 19, 1995, pp. 1287–1303.
"AD606: 50MHz, 80 dB Demodulating Logarithmic Amplifier with Limiter Output," Analog Devices, REV. 0, 1994, pp. 20–29–20–39.

*Primary Examiner*—Nguyen Vo
*Attorney, Agent, or Firm*—Fish & Neave; Steven J. Cahill

[57] ABSTRACT

The invention provides RF power controllers that cancel offset voltages in the power control loop and external offset voltages by coupling the output of the RF power controller to an auto-zero amplifier during STANDBY mode. The auto-zero amplifier controls the output voltage of the RF power controller during each STANDBY mode so as to eliminate the effect of offset voltages. The voltage at the input of the auto-zero amplifier that allows the offset voltages to be canceled is stored during ENABLE mode. The stored voltage is used by the auto-zero amplifier to continue to remove the effect of the offset voltages on the output voltage of the RF power controller during ENABLE mode. Offset drifts due to temperature, power supply changes, etc. are canceled due to frequent offset sampling.

46 Claims, 4 Drawing Sheets

OFFSET VOLTAGE CANCELLATION SYSTEM FOR RADIO FREQUENCY POWER CONTROLLERS

BACKGROUND OF THE INVENTION

The present invention relates to radio frequency (RF) power controllers. More particularly, the present invention relates to RF power controllers with offset voltage cancellation.

An RF power amplifier may output power to, for example, an antenna that acts as a load drawing power from the RF amplifier. An RF power controller is a circuit that regulates the output power of the RF power amplifier. A power control input signal tells the RF power controller what power level the RF power amplifier should send to the antenna when power is required, which may be referred to as "ENABLE" mode. Thus, the ENABLE mode is the period of time during which the antenna draws power from the RF power amplifier. The RF power controller provides an output voltage signal to the RF power amplifier in response to the power control input signal. The output voltage indicates to the RF power amplifier the power level that the RF power amplifier needs to output. The relationship between the output voltage of the RF power controller and the power output by the RF power amplifier in response to the output voltage forms a transfer curve for the RF power amplifier.

The RF power controller regulates the output power signal of the RF power amplifier to the level indicated by the power control input signal using a feedback signal The feedback signal from the RF power amplifier indicates to the RF power controller how much power the RF power amplifier is outputting at a given point in time. The output power requirement of the RF power amplifier may vary as the distance to the base station changes. The RF power controller uses the feedback signal to determine whether the RF power amplifier is outputting the power level called for by the power control input signal. In response to the feedback signal, the RF power controller varies the output voltage signal to the RF power amplifier. The feedback signal closes a loop called the power control loop around the RF power amplifier and the RF power controller.

The power control input signal also indicates when the RF power amplifier no longer requires output power. The RF power controller responds by reducing its output voltage to zero which directs the RF power amplifier to discontinue its power output. The RF power amplifier is essentially dormant during standby mode which follows each enable mode. The duty cycle of the RF power amplifier includes the time the RF amplifier is in ENABLE mode and in STANDBY mode.

RF power controllers can be used in many applications using RF power amplifiers, such as cellular telephones, and wireless data modems. It is important in these applications that the RF power controller regulate the RF power amplifier output signal as accurately as possible. Offset voltages that are associated with the power control input signal and with circuitry within the RF power controller itself can adversely effect the accuracy of the RF power controller output voltage signal.

The problem of offset voltages having an adverse affect on the output signal of RF power controllers has become increasingly important as the power requirements for RF power amplifiers in many applications have decreased, thereby increasing the impact of those offsets. In some cellular phone applications, the output power requirement can be very low (e.g., 5 dBm). In instances when output power requirements are low, offset voltages that cause inaccuracies in the output of the RF power controller are even more important because errors in the RF power controller output may affect a large percentage of its output voltage. Errors in the RF power controller's output voltage often result in inaccurate power output signals from the RF power amplifier. Offset voltages often are difficult to eliminate from the power control loop because they can vary in response to changes in output power levels, power supply inputs, and operating temperature.

Negative offset voltages can cause unwanted steps in the output voltage of the RF power controller. For example, negative offset voltages in the power control loop can cause delays in the start-up of the power control amplifier at the beginning of the ENABLE cycle. The delays may be associated with the turning ON of transistors in the power control amplifier. Once the delay is over, the output voltage of the power control amplifier steps up rapidly as the power control amplifier begins to output voltage in order to acquire the poewr control input signal. Positive offsets can also cause spurious steps in the output voltage of the power control amplifier. Moreover, positive offsets can cause the output voltage of the power control amplifier to step up before voltage is applied to the power control input at the beginning of the ENABLE cycle.

The rapid increase in voltage associated with steps up in output voltage also can cause spurious side band frequencies in the output power of the RF power amplifier that can, themselves, cause interference on adjacent channels. For example, spurious side band frequencies can cause noise in adjacent channels used by other cellular phones. Offset voltages also can prevent an RF power controller from ramping up its output voltage at steady rate, thereby causing spurious side band frequencies. For these reasons it is advantageous to eliminate offset voltages associated with RF power controllers.

Prior art circuits have employed various methods to cancel offset voltages that can creep into the power control loop of RF power controllers. An RF power controller may contain a power control amplifier that amplifies the power control input signal to produce the controller's output voltage. Voltage offsets associated with an RF power controller can be reduced by connecting the input of the power control amplifier to a trim potentiometer, to cancel out the offset voltages. However, manual trimming using a potentiometer is expensive and requires additional PC board area. Also, temperature changes and supply voltage changes may not be accounted for.

Another prior art technique for canceling offsets involves adding negative offsets to the power control amplifier in order to cancel positive offsets associated with other circuitry in the power control loop. However, it may be difficult to match the negative offset with the positive offset to provide complete cancellation. This may especially be a problem when the offset voltages change with operating temperature and power supply input. If too much negative offset is added to the control amplifier, a net negative offset is present that can cause steps in the output voltage at the start of the enable mode.

Another known technique for canceling offsets involves a lookup table that takes into account offset voltages for different RF power levels, input supply voltages, and temperatures. Offset voltages associated with particular RF power controllers may vary depending upon, e.g., RF output power levels, input supply voltages, and operating temperature. RF power controller circuit boards can be tested to determine the offset voltages that are associated with the RF power controller at different RF power levels and temperatures for each individual board. These offset voltages can then be saved in a lookup table. During the operation of the RF power controller, an offset voltage value for a particular operating temperature, input supply voltage, and RF power level can be accessed from the lookup table by additional circuitry to determine the voltage needed at the input of the power control amplifier to cancel out the offset voltages.

Under these circumstances, however, lookup tables must be generated for each individual PC board to fully take into account variations over temperature, input supply voltage, output power levels, and the initial offset voltages. These tables may require complicated algorithms. In addition, the lookup table technique may result in inaccuracies in canceling the offset voltages associated with the RF power controller because the temperature coefficients of offset voltages are unpredictable. An offset voltage associated with particular temperatures may change over time and cannot be accurately predicted with a lookup table. Therefore, prior art circuits using lookup tables to cancel out offset voltages often also use trim potentiometers to cancel out additional offsets that cannot be predicted by a lookup table.

In view of the foregoing, it would be desirable to provide techniques for canceling offset voltages associated with RF power controllers accurately over varying output power requirements, supply voltages, and operating temperature ranges.

It would further be desirable to provide techniques for canceling offset voltages associated with RF power controllers using a minimal amount of additional circuitry.

It would be additionally desirable to provide techniques for automatically canceling offset voltages associated with RF power controllers during each duty cycle that does not need to be manually adjusted or modified for each individual RF power controller.

SUMMARY OF THE INVENTION

Accordingly, it is an object of the present invention to provide RF power controllers which cancel offset voltages associated with RF power controllers accurately over varying output power requirements, supply voltages, and operating temperature ranges.

It is a further object of this invention to provide techniques for canceling offset voltages associated with RF power controllers using a minimal amount of additional circuitry.

It additionally is an object of this invention to provide RF power controllers which have circuitry for automatically canceling offset voltages associated with RF power controllers that do not need to be manually adjusted or modified for each individual RF power controller.

In accordance with these and other objects of the present invention, RF power controllers that provide accurate power output by canceling offset voltages in the power control loop are described.

Accurate power control of RF power amplifiers can be difficult at low power levels due to offset voltages in the power control loop and external offset voltages from the power control input signal. These voltage offsets may be caused by circuitry associated with the RF power controller such as diode peak detectors, power control amplifiers, and digital-to-analog converters (DACs) that often are used to provide the power control input signal. These offset voltages may vary in response to changes in the operating temperature, input supply voltage, and output power level, and initial offset voltage errors.

The RF power controllers of the present invention provide an offset voltage cancellation system (also referred to as the "auto-zero system") that removes the effect of the offset voltages on the output voltage of the RF power controller, allowing for a wider and more accurate power control range. Removal of the offset voltages also eliminates potential spurious steps in the output voltage of the RF power controller. The offset cancellation occurs during STANDBY mode, so as not to disrupt power transmission.

The RF power controllers with offset voltage cancellation system of the present invention cancel offset voltages in the power control loop and external offset voltages by coupling the output of the RF power controller to an auto-zero amplifier during STANDBY mode. The auto-zero amplifier measures the offset voltages and eliminates them during each STANDBY mode. The voltage at the input of the auto-zero amplifier that allows the offset voltages to be canceled is stored during ENABLE mode. The stored voltage is used by the auto-zero amplifier to continue to remove the effect of the offset voltages on the output voltage of the RF power controller during ENABLE mode. Offset drifts due to temperature, power supply changes, etc. are canceled due to frequent offset sampling.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

Figure 1:
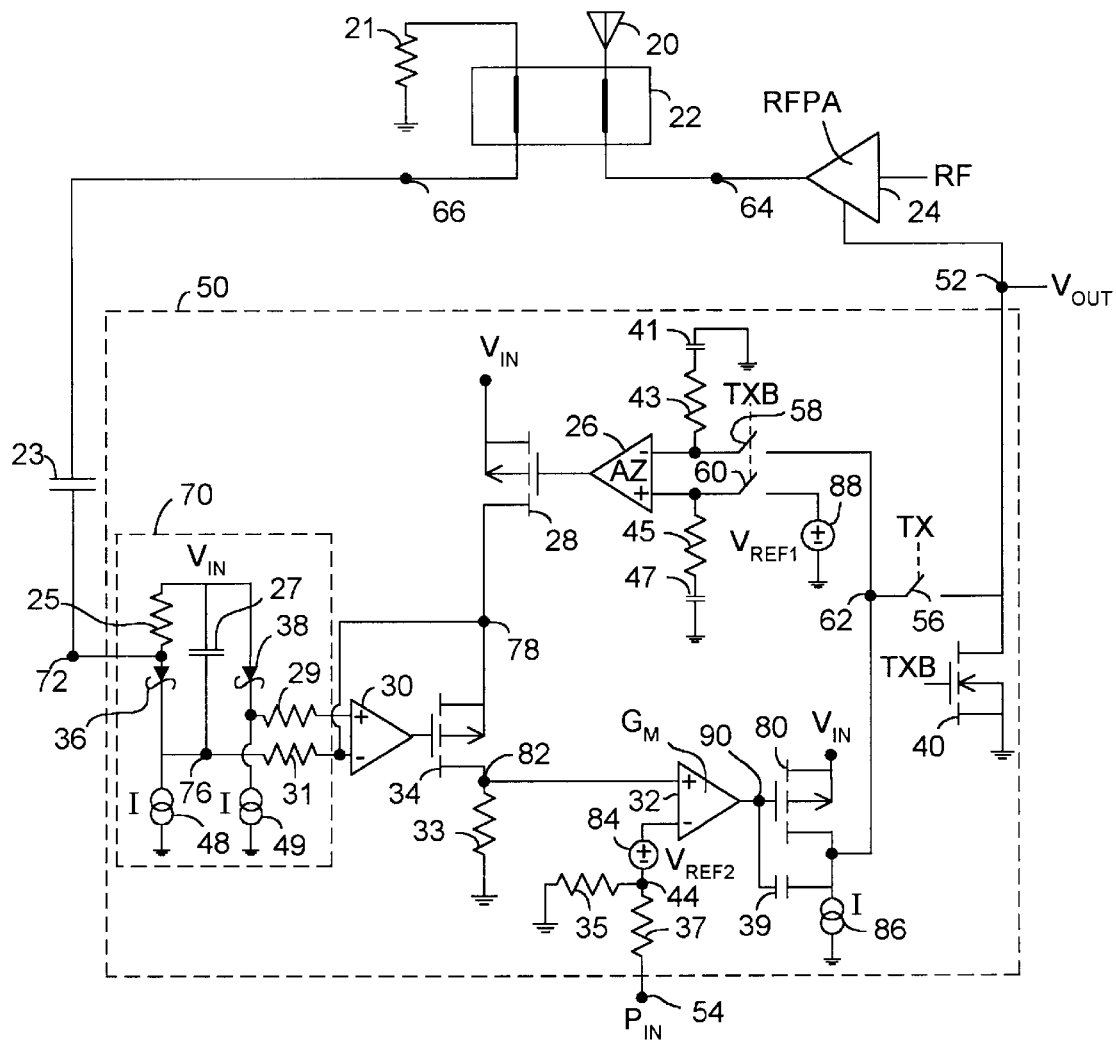
FIG. 1 is a schematic diagram of a RF power control loop with auto-zero offset voltage cancellation using a voltage feedback signal in accordance with the principles of the present invention.

The RF power controllers of the present invention send output control signals to an RF power amplifier. The output control signals are an accurate indication of the power level to be outputted by the RF power amplifier during each enable mode. The RF power controller output control signal is dependent on the power control input signal and the transfer function of the RF power amplifier. A portion of the output of the RF power amplifier is provided as a feedback signal to the RF power controller. The feedback signal from the RF power amplifier is compared to the power control input signal by the power control amplifier which varies its output voltage accordingly to regulate the power output of the RF power amplifier.

The feedback signal indicates how much power is being sent from the RF power amplifier to a load, such as an antenna. The power requirements can change due to varying distance to the base station. The feedback signal can be a voltage feedback signal or a current feedback signal. The power control input signal indicates how much power the RF power amplifier should be providing to the load during each ENABLE mode. If the power output by the RF power amplifier is less than indicated by the power control input signal, the feedback signal causes the RF power controller to output more voltage. Conversely, if the power output by the RF power amplifier is more than indicated by the power control input signal, the feedback signal causes the RF power controller to output less voltage. Thus, the RF power controller adjusts its output voltage based on the feedback signal in order to regulate the output power level of the RF power amplifier to the level indicated by the power control input signal.

The RF power controllers of the present invention eliminate offset voltages that may result in inaccuracies and spurious steps in the output control signal. Referring now to the circuit of FIG. 1, RF power controller 50 supplies an output control signal $V_{OUT}$ at output node 52 to the power control input of RF power amplifier 24. RF power controller 50 receives a power control input signal $P_{IN}$ at node 54. $P_{IN}$ may be received from a circuit such as a DAC (not shown) that indicates when the RF power amplifier should begin to provide power, and at what power level it should be provided. A TX signal at switch 56 sets the duty cycle of the RF power controller. The duty cycle consists of ENABLE mode during which switch 56 is CLOSED, and STANDBY mode during which switch 56 is OPEN. When switch 56 is CLOSED, node 62 is coupled to output node 52 so that RF power controller 50 provides a control signal to RF power amplifier 24. When switch 56 is OPEN, RF power controller 50 is prevented from sending signals to the RF power amplifier.

Figure 2:
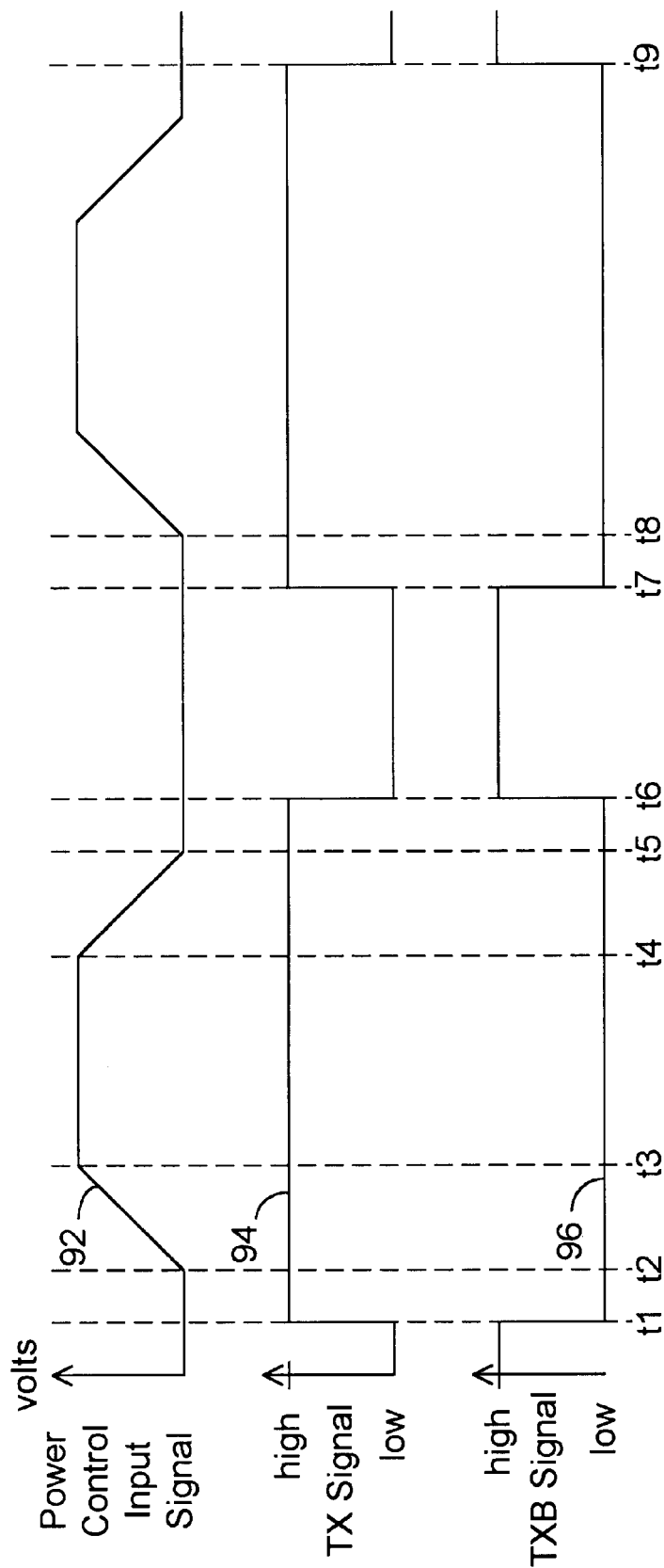
FIG. 2 is a graphical depiction of waveforms of the power control input signal, the TX signal, and the TXB signal.

Referring also now to FIG. 2, the voltage of signal $P_{IN}$ is shown as curve 92. $P_{IN}$ is a signal that indicates the desired level of the power output of the RF power amplifier. $P_{IN}$ is typically provided to power controller 50 from an external source (not shown). Typical applications of RF power amplifier 24 often provide the power requirements as a digital signal. The digital signal must be converted to an analog signal prior to being input to RF power controller 50. This conversion is typically performed by, for example, a DAC. The analog signal is applied to the power control input node 54 as $P_{IN}$ (i.e., curve 92 in FIG. 2).

TX, which is shown as curve 94 in FIG. 2, indicates the duty cycle of RF power amplifier 24. TXB, which is shown as curve 96 in FIG. 2, is inverted from TX. As shown in FIG. 2, at time t1, TX rises from a logic LOW (e.g., 0 volts) to a logic HIGH (e.g., 5 volts) indicating the commencement of ENABLE mode during which RF power amplifier 24 provides output power to the load. ENABLE mode is the period of time that TX is HIGH, e.g., from t1 to t6, and from t7 to t9, as shown in FIG. 2. At time t2, $P_{IN}$ (curve 92) begins to ramp up causing RF power controller 50 to provide a signal to RF power amplifier 24. In response to the signal from RF power controller 50, RF power amplifier 24 provides power to antenna 20. At time t3, $P_{IN}$ stops ramping up and levels off at a fixed value. This value is indicative of the required output power during the current ENABLE mode. At time t4, signal 92 begins to ramp down until time t5 when it reaches zero volts. At time t6, TX returns to LOW, indicating the commencement of STANDBY mode. Antenna 20 requires no power during STANDBY mode. STANDBY mode lasts from time t6 to t7.

Referring again to FIG. 1, TX changes from LOW to HIGH at time t1 causing switch 56 to close. Node 62 now is connected to output node 52 of RF power controller 50. When TX is HIGH, TXB is LOW which turns n-channel MOSFET 40 OFF and disconnects output node 52 from ground. Also, when TXB is LOW, switches 58 and 60 are OPEN, and the inverted and non-inverted inputs of auto-zero amplifier 26 are disconnected from node 62 and voltage source $V_{REF1}$ 88, respectively.

$P_{IN}$ ramps up at time t2 causing current to flow from node 54 across the resistor divider formed by resistors 35 and 37. Thus, the voltage at node 44 is set by the ratio of the resistor divider. The voltage that appears at the inverted input of power control amplifier 32 is the voltage at node 44 plus the voltage of voltage source $V_{REF2}$ 84.

Power control amplifier 32 causes the voltage at node 62 to ramp up after time t2 in response to $P_{IN}$ increasing. P-channel MOSFET 80 controls the current sent to node 62. Increasing voltage at the inverted input of power control amplifier 32 causes the voltage at node 90 to fall, which in turn causes p-channel MOSFET 80 to provide more current to node 62 from $V_{IN}$. When the current through MOSFET 80 exceeds the current through current source 86, the voltage at node 62 increases. Capacitor 39 is set at the Miller capacitance necessary to introduce frequency compensation into the power control loop to stabilize the loop. The finite slope of $P_{IN}$ (curve 92) between times t2 and t3 provides a slow start-up for RF power controller 50 that reduces transient responses within the controller. If desired, p-channel MOSFET 80 may be an n-channel MOSFET if supply voltage $V_{IN}$ is set high enough (e.g., above 3.6 V). The control signal $V_{OUT}$ continues to increase until $P_{IN}$ levels off at time t3.

At time t3, $P_{IN}$ levels off at a fixed voltage level. The output voltage of RF power controller 50 is dependent on the voltage at $P_{IN}$ and the transfer curve of RF power amplifier 24. The output of RF power amplifier 24 at node 64 is sent to antenna 20 via directional coupler 22. Directional coupler 22 may be, for example, a transformer circuit. The output signal of RF power amplifier 24 at node 64 oscillates at the same radio frequency as the RF signal at its input (e.g., 1.8 GHz). Directional coupler 22 feeds back a portion of the signal at node 64 to node 66. The signal at node 66 is proportional to the signal at node 64 and oscillates at the same frequency as the signal at node 64. Capacitor 23 level shifts the signal at node 66 referenced to ground to a signal at node 72 referenced to $V_{IN}$. The signal at node 72, in this instance, is a voltage feedback signal. Persons skilled in the art will appreciate that a current feedback signal could instead be produced without departing from the principles of the present invention. Node 72 is located at the input of RF peak detector 70 of RF power controller 50.

RF peak detector 70 includes input voltage source $V_{IN}$, resistor 25, resistor 29, resistor 31, schottky diodes 36 and 38, capacitor 27, and current sources 48 and 49. $V_{IN}$ is a supply voltage. Current flows from $V_{IN}$ through schottky diodes 36 and 38 and current sources 48 and 49 to ground as shown in FIG. 1. In an ideal circuit, the voltage drops across schottky diodes 36 and 38 are equal.

The feedback voltage at node 72 is converted into a low frequency signal by RF peak detector 70. The signal at node 72 is rectified by schottky diode 36 and smoothed by capacitor 27 to form a low frequency signal at the inverted input of RF detector 30. The voltage at the inverted input of RF detector 30 and node 78 increases as the signal at node 72 increases. As the voltage at node 78 starts to increase, the output voltage of RF detector 30 falls causing p-channel MOSFET 34 to send more current through resistor 33. This current is provided via resistor 31 and regulates the voltage at node 78 creating a virtual ground. RF detector 30 level shifts the voltage feedback signal from $V_{IN}$ to ground so that it can be provided to the non-inverted input of power control amplifier 32. The voltage at the non-inverted input of power control amplifier 32 increases as the voltage drop across resistor 33 increases. Power control amplifier 32 causes $V_{OUT}$ to stop increasing as the voltage at the non-inverted input approaches balance.

The voltage feedback signal at node 72 allows RF power controller 50 to regulate the output power signal of RF power amplifier 24 during ENABLE mode. If the output power signal at node 64 is too high, the feedback signal at node 72 increases, causing power control amplifier 32 to decrease $V_{OUT}$. The decrease in $V_{OUT}$ causes RF power amplifier 24 to output less power. If the output power signal at node 64 is too low, the feedback signal at node 72 decreases, causing power control amplifier 32 to increase $V_{OUT}$. The increase in $V_{OUT}$ causes RF power amplifier 24 to output more power.

$P_{IN}$ drops to zero at time t5 as shown in FIG. 2. As a result, $V_{OUT}$ and the output power signal at node 64 drop to zero. Directional coupler 22 no longer provides a feedback signal to RF peak detector 70. In response, RF detector 30 reduces the voltage at node 82 to $V_{REF2}$. In an ideal circuit, the voltages at the inputs of power control amplifier 32 both equal $V_{REF2}$ after time t5, and the voltage at node 62 is approximately zero volts (e.g., 200 μV). However, in practical RF power controllers, the differential voltage at the inputs of power control amplifier 32 may vary from zero by a significant amount due to power control amplifier 32 offset voltages (e.g., 10 mV). In addition, voltages at node 82 may be higher or lower than $V_{REF2}$ due to offset voltages at $P_{IN}$ and RF peak detector 70 offsets.

$V_{REF2}$ 84 introduces a small voltage at the inverted input of power control amplifier 32 (e.g., 50 mV). Any offset voltage at node 54 causes the voltage at the inverted input of the power control amplifier 32 to vary from $V_{REF2}$ during STANDBY mode, when $P_{IN}$ should be zero. An offset is present at the inputs of RF detector 30 if the voltage drops across schottky diodes 36 and 38 are not equal or if there are offsets at the inputs of RF detector 30. The offsets may cause too much or too little current to flow through MOSFET 34 during STANDBY mode causing the voltage at node 82 to be above or below $V_{REF2}$ by some offset voltage. In addition, there may be offset voltages present in power control amplifier 32. Any of these offset voltages can be positive or negative.

A negative offset voltage at node 82 can cause the voltage at node 62 to ramp up to $V_{IN}$ during STANDBY mode when switch 56 is OPEN. With a negative offset voltage present, the voltage at node 62 may be at $V_{IN}$ when ENABLE mode begins, causing an inaccurate control signal $V_{OUT}$. When switch 56 is CLOSED during ENABLE mode, negative offset voltages continue to cause RF power controller 50 to output an inaccurate control voltage. The inaccurate control voltage at node 52 causes RF power amplifier 24 to output an inaccurate power output. A positive offset voltage can cause transistors in power control amplifier 32 to turn OFF during STANDBY mode, introducing a delay into the start-up of power control amplifier 32. The delay can cause unwanted steps in $V_{OUT}$ when power control amplifier 32 starts up during ENABLE mode.

$V_{OUT}$ may be inaccurate throughout ENABLE mode due to the offset voltages. Offset voltages associated with RF power controller 50 can cause the gain of power control amplifier 32 to vary significantly (e.g., 5–10%). The offset voltages can be eliminated during STANDBY mode by coupling auto-zero loop circuitry (which includes auto-zero amplifier 26) around the power control amplifier 32 as shown in FIG. 1. The auto-zero loop circuitry forms a closed loop around power control amplifier 32 during STANDBY mode.

In RF power controller 50 of FIG. 1, the offset voltages associated with RF power controller 50 are canceled by auto-zero amplifier 26 during STANDBY mode. At time t6 (see FIG. 2), TX goes LOW causing switch 56 to open, disconnecting node 62 from output node 52. Also at time t6, TXB goes HIGH causing n-channel MOSFET 40 to turn ON, coupling $V_{OUT}$ to ground. TXB also causes switches 58 and 60 to close, coupling the inverted input of auto-zero amplifier 26 to node 62 and the non-inverted input of auto-zero amplifier 26 to voltage source $V_{REF1}$ 88. $V_{REF1}$ 88 is a reference voltage source.

During STANDBY mode, auto-zero amplifier 26 causes the voltage at node 62 to be $V_{REF1}$, eliminating the adverse effect of offset voltages associated with RF power controller 50. $V_{REF1}$ preferably is a small positive voltage (e.g., 100 mV), so that the transistors in power control amplifier 32 are ON during STANDBY mode to eliminate unwanted steps in $V_{OUT}$ at time t8. If auto-zero amplifier 26 detects that the voltage at node 62 is greater than the voltage at $V_{REF1}$, the output of auto-zero amplifier 26 decreases. A decrease in the voltage at the gate of p-channel MOSFET 28 causes an increase in the current flowing from $V_{IN}$ through MOSFET 28 to node 78. An increase in voltage at node 78 is detected at the inverted input of RF detector amplifier 30. RF detector amplifier 30 causes MOSFET 34 to output more current through resistor 33 in response to the increase in voltage at node 78. The voltage at node 82 increases with the increased voltage drop across resistor 33. Power control amplifier 32 causes MOSFET 80 to output less current to node 62 in response to the increase in the voltage at node 82, thereby reducing the voltage at node 62. The closed loop formed by the auto-zero loop circuitry causes the voltage at node 62 to decrease until it is equal to the voltage at $V_{REF1}$. At this point, the voltages at the inputs of the power control amplifier 32 reflect the power control amplifier offsets.

If auto-zero amplifier 26 detects that the output of power control amplifier 32 is below $V_{REF1}$, auto-zero amplifier 26 causes the voltage at the non-inverted input of power control amplifier 32 to decrease by sending less current through p-channel MOSFET 28. The reduction in current through MOSFET 28 causes the voltage at node 78 to decrease. RF detector amplifier 30 causes MOSFET 34 to output less current through resistor 33 in response to the decrease in voltage at node 78. The resulting decrease in voltage at node 82 causes power control amplifier 32 to increase the current through p-channel MOSFET 80. In this way, auto-zero amplifier 26 causes the voltage at node 62 to increase until it equals $V_{REF1}$. Auto-zero amplifier 26 holds the voltage at node 62 at $V_{REF1}$ throughout the remainder of STANDBY mode, eliminating the effect of offset voltages. This allows the voltage at node 62 to be near zero when RF power amplifier 24 begins to require power at time t8, resulting in an accurate output signal $V_{OUT}$. The duration of STANDBY mode should be at least as long as it takes for auto-zero amplifier 26 to match the voltage at node 62 with $V_{REF1}$.

Auto-zero amplifier 26 cancels both positive and negative offset voltages. The offset voltages exist when the voltages at the inputs of power control amplifier 32 are unequal. Auto-zero amplifier 26 cancels the offset voltages by setting voltages at the non-inverting input of power control amplifier 32 during STANDBY mode so that voltage at node 62 approaches $V_{REF1}$.

At the start of the next ENABLE mode at time t7 (FIG. 2), switches 58 and 60 are opened, switch 56 is closed, and MOSFET 40 is turned OFF. $P_{IN}$ starts to ramp up at time t8. RF power controller 50 can output a control voltage to RF power amplifier 24 immediately at time t8, because auto-zero amplifier 26 has canceled any negative offset voltages that may have caused a delay in the start-up of power control amplifier 32. In addition, power control amplifier 32 is biased slightly ON. Therefore, there is no step in $V_{OUT}$ at time t8 when $P_{IN}$ ramps up. $V_{OUT}$ now ramps up from $V_{REF1}$ at time t8 since all positive offset voltages have been canceled from the power control loop as well. RF power controller 50 may now accurately regulate the output power signal of RF power amplifier 24.

Between times t7 and t9, switch 58 is OPEN so that auto-zero amplifier 26 cannot hold node 62 at $V_{REF1}$ while power control amplifier 32 outputs a control signal to RF power amplifier 24. The differential voltage at the inputs of auto-zero amplifier 26 is held on capacitors 41 and 47 when switches 58 and 60 are OPEN after time t7. Opening both switches 58 and 60 allows the voltage on capacitors 41 and 47 to decay at approximately the same rate so that the differential voltage between the inputs of auto-zero amplifier 26 is substantially preserved throughout an ENABLE mode. Choosing equal capacitance values for capacitors 41 and 47 further helps to ensure that the voltages at the inputs of auto-zero amplifier 26 decay at the same rate. If desired, capacitor 47 and switch 60 can be eliminated such that $V_{REF1}$ is coupled to the non-inverting input of auto-zero amplifier 26 throughout ENABLE mode and STANDBY mode. This technique may be desirable if the capacitance of capacitor 41 can be made large enough so that the differential voltage between $V_{REF1}$ and the voltage on capacitor 41 can be preserved throughout ENABLE mode without capacitor 47.

Capacitors 41 and 47 allow auto-zero amplifier 26 to continue to cancel the offset voltages associated with RF power controller 50 that were detected during the previous STANDBY mode. The offset voltages continue to be canceled during the next ENABLE mode while the inverting input of auto-zero amplifier 26 is disconnected from node 62. The differential voltage held on capacitors 41 and 47 allows auto-zero amplifier 26 to set a current through MOSFET 28 that was determined during the previous STANDBY mode to eliminate the offset voltages. Auto-zero amplifier 26 uses this differential voltage to continue to eliminate the effect of the offset voltages during ENABLE mode. Any additional offset voltages that creep into the RF power control loop during ENABLE mode are canceled out by the auto-zero amplifier during the next STANDBY mode.

Resistors 43 and 45 are provided between capacitors 41 and 47 and the inputs to auto-zero amplifier 26 as shown in FIG. 1 to introduce frequency compensation into the auto-zero loop around power control amplifier 32 in order to stabilize the loop. Resistors 43 and 45 remove the phase shift in the loop that is introduced by capacitors 41 and 47. Without resistors 43 and 45, oscillations may be present in the auto-zero loop.

If desired, the supply voltage of the RF power controller 50 can be extended between a positive and negative value (e.g., from +3 V to −3 V). In FIG. 1, $V_{IN}$ would be set at the positive supply voltage, and the grounded terminals can be set at the negative supply voltage. Voltage sources $V_{REF1}$ and $V_{REF2}$ and capacitor 23 may be eliminated in a controller using such supply ranges. The non-inverting input of auto-zero amplifier 26 can be grounded during STANDBY mode so that GROUND is the reference voltage used by auto-zero amplifier 26 to cancel the offset voltages. The inverting input of power control amplifier 32 is zero during STANDBY mode plus any offset voltages in $P_{IN}$. The voltage at node 62 can now be regulated to zero volts by auto-zero amplifier 26 without causing steps in $V_{OUT}$ at the beginning of ENABLE mode.

Figure 3:
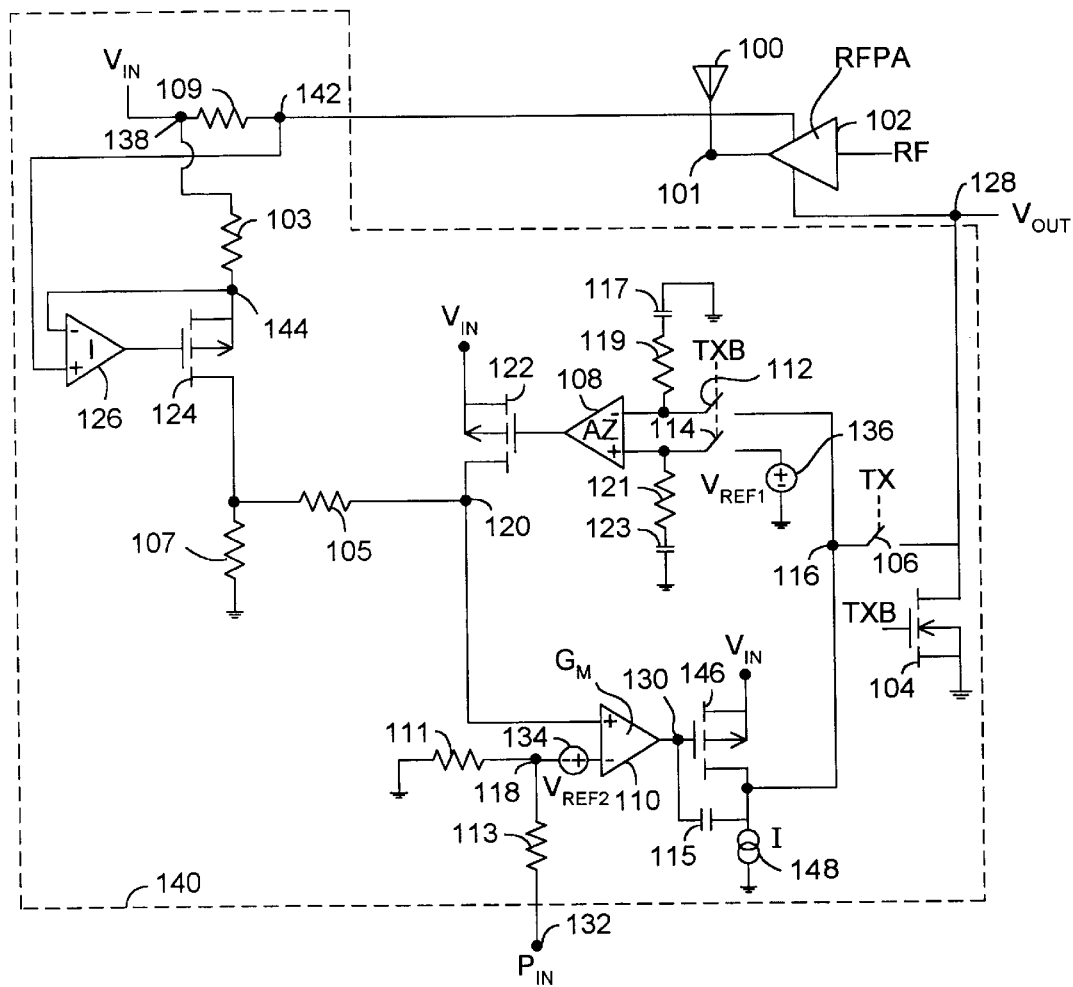
FIG. 3 is a schematic diagram of a RF power control loop with auto-zero offset voltage cancellation using a current feedback signal in accordance with the principles of the present invention.

Referring now to FIG. 3, RF power controller 140 provides an output voltage signal $V_{OUT}$ at node 128 to RF power amplifier 102. $V_{OUT}$ is dependent on $P_{IN}$ applied at node 132 during ENABLE mode and the transfer function of RF Power amplifier 102. RF power amplifier 102 provides power to antenna 100 via node 101. The power output signal of RF power amplifier 102 is set by $V_{OUT}$. RF power controller 140 uses a current feedback signal from current sense resistor 109 to regulate the power output signal of RF power amplifier 102.

The inverting input of power control amplifier 110 is coupled to $P_{IN}$ through resistor 113 and voltage source $V_{REF2}$ 134. Current flows from $P_{IN}$ through the resistor divider formed by resistors 113 and 111 to ground. The voltage at node 118 is a fraction of the voltage applied to node 132. The ratio of the resistance values of resistors 113 and 111 determines the fraction. The voltage that appears at the inverting input of power control amplifier 110 is the voltage at node 118 plus the voltage of voltage source $V_{REF2}$ 134. Voltage source $V_{REF2}$ may be a small positive value (e.g., 50 mV).

Power control amplifier 110 controls the current through p-channel MOSFET 146 by controlling its gate voltage at node 130. When power control amplifier 110 senses an increase in voltage at its inverting input (at time t2 in FIG. 2), the voltage at node 130 decreases causing more current to flow through p-channel MOSFET 146 from $V_{IN}$. When the current through MOSFET 146 exceeds the current through current source 148, the voltage at node 116 begins to rise. Capacitor 115 is set at the Miller capacitance necessary to introduce frequency compensation into the power control loop to stabilize the loop.

Switch 106 is closed at time t1 and an output signal is sent to output node 128 starting at time t2 to control the power output signal of RF power amplifier 102. At time t3, the signal at $P_{IN}$ stops increasing. RF power amplifier 102 begins to draw supply current from input voltage source $V_{IN}$ at node 138 around time t2. $V_{IN}$ is a supply voltage. Current begins to flow from $V_{IN}$ through sense resistor 109 to RF power amplifier 102 creating a voltage drop across resistor 109. The voltage drop across resistor 109 appears between nodes 138 and 142. The supply current drawn by RF power amplifier 102 from $V_{IN}$ is proportional to the power output signal of RF power amplifier 102 at node 101. Thus, if the power output signal of RF power amplifier 102 decreases, the current that RF power amplifier 102 draws from $V_{IN}$ also decreases. If the power output signal of RF power amplifier 102 increases, the current that RF power amplifier 102 draws from $V_{IN}$ also increases. The RF power controller 140 measures the current that RF power amplifier 102 is drawing from $V_{IN}$ to indirectly measure the power output signal at node 101.

Current sense amplifier 126 measures the current through sense resistor 109 to generate a voltage signal indicative of the current through resistor 109. The voltage signal is applied to power control amplifier 110 at node 120. Current sense amplifier 126 senses the current through resistor 109 as follows.

Current sense amplifier 126 amplifies the difference between the voltage at node 142 and the voltage at node 144.

The resistance value of resistor 103 should be significantly larger than resistor 109 so that most of the current drawn from $V_{IN}$ at node 138 flows through resistor 109 to RF power amplifier 102 (e.g., the ratio of resistors 103 to 109 may be 2000:1). The voltage at node 142 is near $V_{IN}$ when RF power amplifier 102 is drawing little or no current. As the current through sense resistor 109 increases, the voltage at node 142 drops. The drop in voltage at node 142 is amplified by current sense amplifier 126 and applied to the gate of p-channel MOSFET 124 causing p-channel MOSFET 124 to draw more current from $V_{IN}$ through resistor 103 and into resistor 107. The increased current into resistor 107 causes the voltage at the plus input of power control amplifier 110 (node 120) to rise. Power control amplifier 110 causes MOSFET 146 to reduce $V_{OUT}$ in response to the increase in voltage at node 120. Thus, $V_{OUT}$ stops increasing when RF power amplifier 102 draws current through resistor 109 and when node 120 approaches the balance voltage. The current feedback signal allows RF power controller 140 to regulate the output power signal of RF power amplifier 102.

The current feedback signal also indicates to RF power controller 140 when the output power signal of RF power amplifier 102 is too low. Current sense amplifier 126 senses a decrease in the current through resistor 109. In response, current sense amplifier 126 causes the current through MOSFET 124 to decrease, which causes the voltage at node 120 to decrease. Power control amplifier 110 senses the decrease in voltage at node 120 and causes MOSFET 146 to increase $V_{OUT}$. The increase in $V_{OUT}$ indicates to RF power amplifier 102 to increase its power output signal. Thus, the current feedback signal from resistor 109 indicates to RF power controller 140 when RF power amplifier 102 needs to increase or decrease its output power signal during ENABLE mode.

At time t6, TX goes LOW and TXB goes HIGH causing ENABLE mode to end and STANDBY mode to begin. When TX is LOW, switch 106 is open, disconnecting node 116 from output node 128. When TXB is HIGH, n-channel MOSFET 104 is ON, coupling output node 128 to ground. With TX LOW, switches 112 and 114 are closed, connecting the inverting and non-inverting inputs of auto-zero amplifier 108 to node 116 and voltage source $V_{REF1}$ 136, respectively. Auto-zero amplifier 108 now senses whether the voltage at node 116 is above or below $V_{REF1}$. The value of $V_{REF1}$ may be slightly above zero (e.g., 100 mV). The differential voltage at the inputs of auto-zero amplifier 108 is amplified by auto-zero amplifier 108 and applied to the gate of p-channel MOSFET 122.

If the voltage at node 116 is greater than $V_{REF1}$, the output of auto-zero amplifier 108 decreases causing more current to flow through p-channel MOSFET 122 and resistor 105. Consequently, the voltage at node 120 increases causing power control amplifier 110 to decrease the voltage at node 116. If the voltage at node 116 is less than $V_{REF1}$, the output of auto-zero amplifier 108 increases causing less current to flow through p-channel MOSFET 122 and resistor 105. Consequently, the voltage at node 120 decreases causing power control amplifier 110 to increase the voltage at node 116. Thus, auto-zero amplifier 108 regulates the at voltage node 116 at $V_{REF1}$ during STANDBY mode, in order to cancel any positive or negative offset voltages in the power control loop.

During the next ENABLE mode between times t7 and t9, switches 112 and 114 are open and the voltage at node 116 remains at 100 mv. Power control amplifier 110 is ready to start sending a control signal to RF power amplifier 102 at the beginning of ENABLE mode because auto-zero amplifier 108 has canceled any negative offset voltages that may have caused a delay in the start-up of power control amplifier 110 and has pre-biased power control amplifier 110 to be slightly ON. Therefore, there is no step in $V_{OUT}$ after $P_{IN}$ begins to ramp up. $V_{OUT}$ now ramps up immediately from 100 mv since all positive and negative offset voltages have been canceled from the power control loop. RF power controller 140 can now accurately regulate the output power signal of RF power amplifier 102.

During the next ENABLE mode between times t7 and t9, the differential voltage at the inputs of auto-zero amplifier 108 is held on capacitors 117 and 123 when switches 112 and 114 are open. The differential voltage allows auto-zero amplifier 108 to continue to cancel the offset voltages present in the RF power control loop during the next ENABLE mode. Any additional offset voltages that creep into the RF power control loop are canceled by auto-zero amplifier 108 during the next STANDBY mode when switches 112 and 114 close again. Resistors 119 and 121 are added between capacitors 117 and 123 and the inputs of auto-zero amplifier 108 as shown in FIG. 3 to introduce frequency compensation into the auto-zero loop to stabilize the loop.

Figure 4:
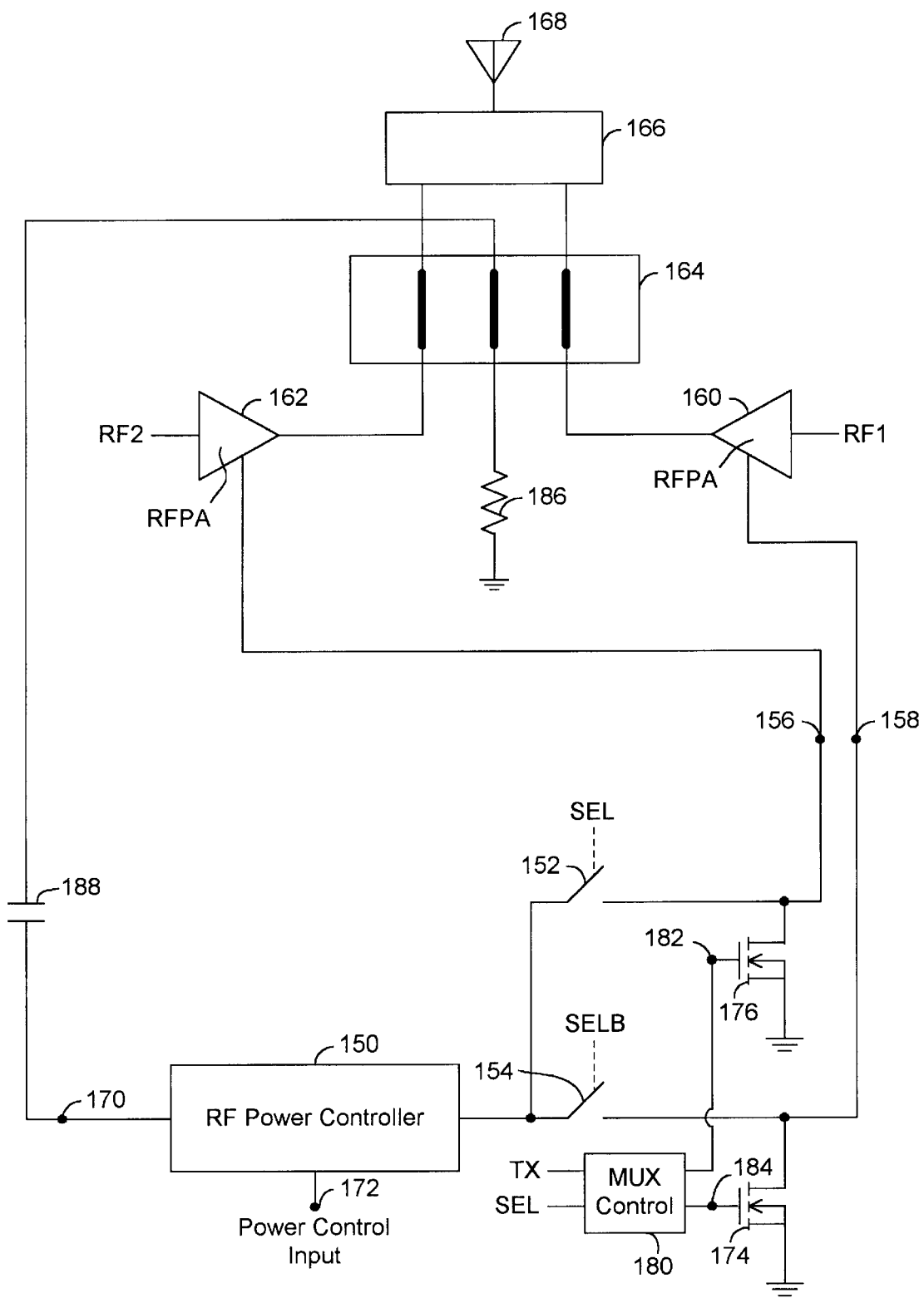
FIG. 4 is a schematic diagram of an RF power controller which is adapted to regulate the output power of two RF power amplifiers in accordance with the principles of the present invention.

Referring now to FIG. 4, RF power controller 150 with a dual band output according to the present invention is shown. RF power controller 150 may have the offset voltage cancellation system of FIG. 1. RF power controller 150 accepts a voltage feedback signal from node 170, such as RF power controller 50 in FIG. 1. Voltage is fed back from RF power amplifier 160 or 162 at node 170 via directional coupler 164 when either amplifier is outputting power. RF power amplifiers 160 and 162 are adapted to send power to antenna 168. Either the output of RF power amplifier 160 or 162 is connected to antenna 168 through diplexer 166. The power control input signal is provided at node 172.

RF power controller 150 is adapted to send power to one of two RF power amplifiers: 160 or 162. The output of RF power controller 150 may be coupled to output node 156 or 158 depending upon the user selected value of signals SEL and SELB (SELB simply is SEL inverted). A user sets SEL HIGH to couple RF power controller 150 to RF power amplifier 162. When SEL is HIGH (and SELB is LOW), switch 152 is closed and switch 154 is opened and RF power controller 150 sends a control signal to RF power amplifier 162 during ENABLE mode.

MUX control 180, which may be a multiplexer, switches n-channel MOSFET 176 ON and OFF according to the duty cycle indicated by TX when SEL is HIGH. MUX control 180 causes MOSFET 176 to be OFF during ENABLE mode when TX is HIGH and ON during STANDBY mode when TX is LOW coupling node 156 to ground. When SEL is HIGH, MUX control 180 keeps MOSFET 174 ON during ENABLE mode and STANDBY mode.

Setting SEL LOW couples RF power controller 150 to RF power amplifier 160. When SEL is LOW, switch 154 is closed and switch 152 is open. RF power controller 150 may now send a control signal to RF power amplifier 160 during ENABLE mode. MUX control circuit 180 switches n-channel MOSFET 174 ON and OFF according to the duty cycle as indicated by TX when SEL is LOW. When SEL is LOW, MUX control 180 keeps MOSFET 176 ON during ENABLE mode and STANDBY mode.

Dual band RF power controller 150 may also be a controller which accepts a current feedback signal (such as RF power controller 140 in FIG. 3) from the supply current drawn by two RF power amplifiers. Persons skilled in the art further will recognize that the circuitry of the present invention may be implemented using circuit configurations other than those shown and discussed above. All such modifications are within the scope of the present invention, which is limited only by the claims which follow.

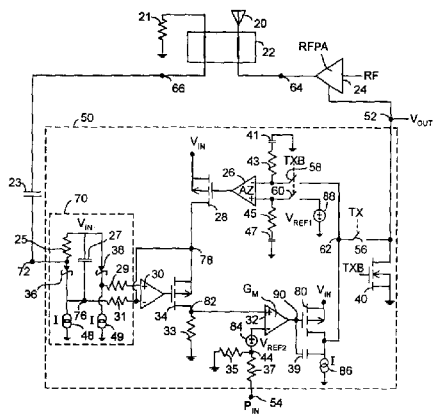

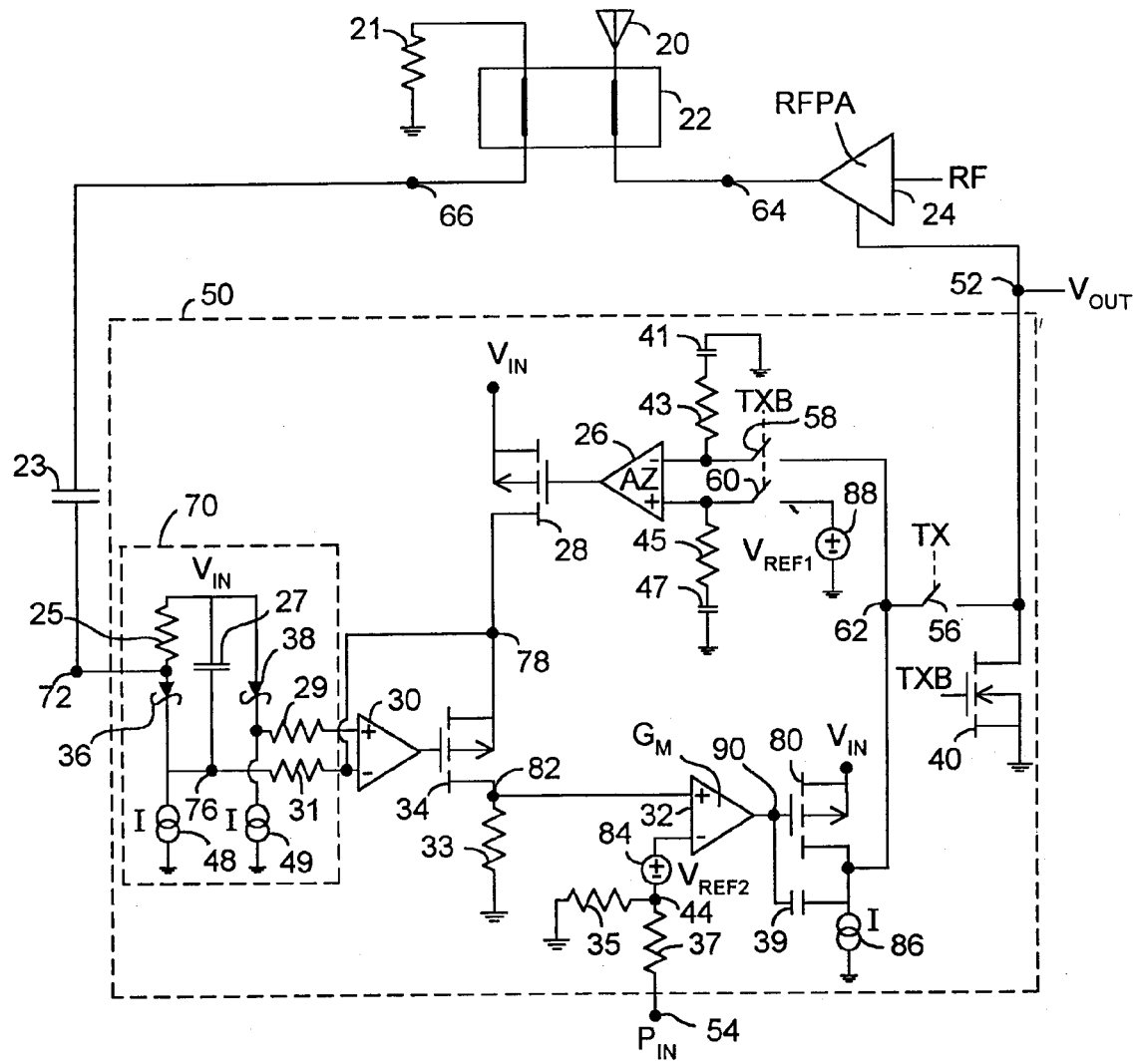

What is claimed is:

1. An RF power controller comprising:
    a power control amplifier coupled to an RF power amplifier to provide the RF power amplifier with a control signal during ENABLE mode, the RF power amplifier providing a power output signal in response to the control signal;
    feedback circuitry that provides a feedback signal indicative of the power output signal, the feedback circuitry being coupled to the RF power amplifier and to an input of the power control amplifier, the control signal being set based on the difference between the feedback signal and a power control input signal; and
    auto-zero loop circuitry coupled to the power control amplifier, the feedback circuitry and the RF power amplifier, the auto-zero control circuitry operating to close a cancellation loop while measuring and storing voltage offsets during STANDBY mode, and to provide a signal that cancels the measured offset voltage during ENABLE mode.

2. The controller of claim 1 wherein the auto-zero loop circuitry comprises an auto-zero amplifier coupled to an input and an output of the power control amplifier during STANDBY mode and coupled to the input of the power control amplifier during ENABLE mode, the auto-zero amplifier measuring voltage offsets during STANDBY mode and providing the signal that cancels the measured offset voltage during ENABLE mode.

3. The controller of claim 2 wherein the auto-zero loop circuitry further comprises a reference voltage coupled to an input of the auto-zero amplifier during STANDBY mode, the auto-zero amplifier measuring voltage offsets during STANDBY mode using the reference voltage.

4. The controller of claim 2 wherein the auto-zero loop circuitry further comprises a first switch and a first capacitor, both being coupled to an input of the auto-zero amplifier, the first switch being open during ENABLE mode to open the cancellation loop, the voltage at the input of the auto zero amplifier being stored on the first capacitor during ENABLE mode.

5. The controller of claim 4 wherein the auto-zero loop circuitry further comprises a reference voltage coupled to a second input of the auto-zero amplifier during STANDBY mode, the auto-zero amplifier measuring the voltage offsets during STANDBY mode using the reference voltage.

6. The controller of claim 5 wherein the auto-zero loop circuitry further comprises a second switch and a second capacitor, both being coupled to the second input of the auto-zero amplifier, the second switch being open during ENABLE mode so that the reference voltage at the second input of the auto zero amplifier is stored on the second capacitor during ENABLE mode.

7. The controller of claim 1 wherein feedback circuitry provides a voltage feedback signal.

8. The controller of claim 7 wherein the feedback circuitry comprises an RF peak detector circuit for providing a low frequency voltage feedback signal.

9. The controller of claim 8 wherein the feedback circuitry further comprises an RF detector amplifier for level shifting the low frequency voltage feedback signal to be provided to the input of the power control amplifier.

10. The controller of claim 1 wherein the feedback circuitry provides a voltage representative of a current supplied to the RF power amplifier.

11. The controller of claim 10 wherein the feedback circuitry comprises a current sense amplifier for sensing the current supplied to the RF power amplifier, the current sense amplifier providing the feedback signal indicative of the power output signal to the input of the power control amplifier.

12. The controller of claim 1 wherein the power control amplifier is coupled to a second RF power amplifier, the controller being adapted to regulate a second power output signal of the second RF power amplifier.

13. The controller of claim 1 further comprising a reference voltage source coupled between a second input of the power control amplifier and the power control input signal.

14. The controller of claim 1 further comprising an output node coupled to the RF power amplifier and a switch coupled between the output node and the power control amplifier, the switch being open during STANDBY mode and closed during ENABLE mode so that the power control amplifier can supply the control signal to the RF power amplifier during ENABLE mode.

15. The controller of claim 1 wherein the auto-zero loop circuitry operates to close the cancellation loop to exclude the RF power amplifier during STANDBY mode and to include the RF power amplifier during ENABLE mode.

16. An RF power controller comprising:
    means for providing a control signal to an RF power amplifier, the means for providing being coupled to the RF power amplifier to provide the RF power amplifier with the control signal only during ENABLE mode, the RF power amplifier providing a power output signal in response to the control signal;
    means for generating a feedback signal indicative of the power output signal, the means for generating being coupled to the RF power amplifier and to an input of the means for providing, the control signal being set based on the difference between the feedback signal and a power control input signal; and
    means for closing a cancellation loop to measure and store voltage offsets during STANDBY mode, and for providing a signal that cancels the measured offset voltage during ENABLE mode, the means for closing the cancellation loop being coupled to the means for providing, the means for generating, and the RF power amplifier.

17. The controller of claim 16 wherein the means for closing comprises an auto-zero amplifier coupled to an input and an output of the means for providing during STANDBY mode and coupled to the input of the means for providing during ENABLE mode, the auto-zero amplifier measuring the offset voltage during STANDBY mode and providing the signal that cancels the offset voltage during ENABLE mode.

18. The controller of claim 17 wherein the means for closing further comprises a reference voltage coupled to an input of the auto-zero amplifier during STANDBY mode, the auto-zero amplifier measuring the offset voltage during the STANDBY mode using the reference voltage.

19. The controller of claim 17 wherein the means for closing further comprises a first switch and a first capacitor, both being coupled to an input of the auto-zero amplifier, the first switch being open during ENABLE mode to open the cancellation loop, the voltage at the input of the auto zero amplifier being stored on the first capacitor during ENABLE mode.

20. The controller of claim 19 wherein the means for closing further comprises a reference voltage coupled to a second input of the auto-zero amplifier during STANDBY mode, the auto-zero amplifier measuring the voltage offsets during the STANDBY mode using the reference voltage.

21. The controller of claim 20 wherein the means for closing further comprises a second switch and a second capacitor, both being coupled to the second input of the auto-zero amplifier, the second switch being open during ENABLE mode so that the reference voltage at the second input of the auto zero amplifier is stored on the second capacitor during ENABLE mode.

22. The controller of claim 16 wherein the feedback signal is a voltage feedback signal.

23. The controller of claim 22 wherein the means for generating comprises an RF peak detector circuit for providing a low frequency voltage feedback signal.

24. The controller of claim 23 wherein the means for generating further comprises an RF detector amplifier for level shifting the low frequency voltage feedback signal to be provided to the input of the power control amplifier.

25. The controller of claim 16 wherein the means for generating provides a voltage representative of a current supplied to the RF power amplifier.

26. The controller of claim 25 wherein the means for generating comprises a current sense amplifier for sensing the current supplied to the RF power amplifier, the current sense amplifier providing the feedback signal indicative of the power output signal to the input of the means for providing.

27. The controller of claim 16 wherein the means for providing is coupled to a second RF power amplifier, the controller being adapted to regulate a second power output signal of the second RF power amplifier.

28. The controller of claim 16 further comprising a reference voltage source coupled between a second input of the means for providing and the power control input signal.

29. The controller of claim 16 further comprising an output node coupled to the RF power amplifier and a switch coupled between the output node and the means for providing, the switch being open during STANDBY mode and closed during ENABLE mode so that the means for providing can supply the control signal to the RF power amplifier during ENABLE mode.

30. The controller of claim 16 wherein the means for closing operates to close the cancellation loop to exclude the RF power amplifier during STANDBY mode and to include the RF power amplifier during ENABLE mode.

31. A method for regulating a power output signal of an RF power amplifier using an RF power controller, the method comprising:
 providing a control signal to the RF power amplifier only during ENABLE mode for regulating the power output signal of the RF power amplifier using a power control amplifier, the RF power amplifier providing the power output signal in response to the control signal;
 generating a feedback signal indicative of the power output signal, the feedback signal being provided to an input of the power control amplifier, the control signal being set by the power control amplifier based on the difference between the feedback signal and a power control input signal;
 closing a cancellation loop coupled to the power control amplifier to measure and store voltage offsets during STANDBY mode; and
 providing a signal using the cancellation loop that cancels the measured offset voltage during ENABLE mode.

32. The method of claim 31 wherein the cancellation loop comprises an auto-zero amplifier that is coupled to an input and an output of the power control amplifier during STANDBY mode and that is coupled to the input of the power control amplifier during ENABLE mode; and wherein closing the cancellation loop further comprises measuring the offset voltage during STANDBY mode using the auto-zero amplifier.

33. The method of claim 32 wherein providing the signal further comprises providing the signal that cancels the offset voltage from the auto-zero amplifier to the input of the power control amplifier during ENABLE mode.

34. The method of claim 32 wherein closing the cancellation loop further comprises measuring the voltage offsets using a reference voltage coupled to an input of the auto-zero amplifier during STANDBY mode.

35. The method of claim 32 wherein closing the cancellation loop further comprises storing the voltage offsets using a first switch and a first capacitor, both being coupled to an input of the auto-zero amplifier, the first switch being open during ENABLE mode to open the cancellation loop, the voltage at the input of the auto zero amplifier being stored on the first capacitor during ENABLE mode.

36. The method of claim 35 wherein closing the cancellation loop further comprises measuring the voltage offsets using a reference voltage coupled to a second input of the auto-zero amplifier during STANDBY mode.

37. The method of claim 36 wherein closing the cancellation loop further comprises storing the voltage offsets using a second switch and a second capacitor, both being coupled to the second input of the auto-zero amplifier, the second switch being open during ENABLE mode so that the reference voltage at the second input of the auto zero amplifier is stored on the second capacitor during ENABLE mode.

38. The method of claim 31 wherein generating the feedback signal further comprises generating a voltage feedback signal.

39. The method of claim 38 wherein generating the feedback signal further comprises generating a low frequency voltage feedback signal using an RF peak detector circuit.

40. The method of claim 39 wherein generating the feedback signal further comprises level shifting the low frequency voltage feedback signal to be provided to the input of the power control amplifier using an RF detector amplifier.

41. The method of claim 31 wherein generating the feedback signal further comprises generating a voltage representative of a current supplied to the RF power amplifier.

42. The method of claim 41 wherein generating the voltage representative of the current supplied to the RF power amplifier is performed using a current sense amplifier to provide the voltage representative of the current supplied to the RF power amplifier to the input of the power control amplifier.

43. The method of claim 31 wherein providing the control signal further comprises providing a second control signal to a second RF power amplifier to regulate a second power output signal of the second RF power amplifier.

44. The method of claim 31 wherein closing the cancellation loop further comprises measuring the voltage offsets using a reference voltage source coupled between a second input of the power control amplifier and the power control input signal.

45. The method of claim 31 wherein providing the control signal further comprises providing the control signal to the RF power amplifier from an output node coupled to the RF power amplifier and a switch coupled between the output node and the power control amplifier, the switch being open during STANDBY mode and closed during ENABLE mode so that the power control amplifier can supply the control signal to the RF power amplifier during ENABLE mode.

46. The method of claim 31 wherein closing the cancellation loop further comprises closing the cancellation loop to exclude the RF power amplifier during STANDBY mode.

* * * * *

UNITED STATES PATENT AND TRADEMARK OFFICE
CERTIFICATE OF CORRECTION

PATENT NO. : 6,167,242
DATED : December 26, 2000
INVENTOR(S) : Henderson et al.

It is certified that error appears in the above-identified patent and that said Letters Patent is hereby corrected as shown below:

<u>Column 2,</u>
Line 19, replace "poewr" with -- power --.

Signed and Sealed this

Fourth Day of December, 2001

*Attest:*

*Attesting Officer*

NICHOLAS P. GODICI
*Acting Director of the United States Patent and Trademark Office*

United States Patent [19]
Henderson et al.

[11] Patent Number: 6,167,242
[45] Date of Patent: Dec. 26, 2000

[54] OFFSET VOLTAGE CANCELLATION SYSTEM FOR RADIO FREQUENCY POWER CONTROLLERS

[75] Inventors: Edward L. Henderson, Atkinson, N.H.; David B. Bell, Los Altos, Calif.

[73] Assignee: Linear Technology Corporation, Milpitas, Calif.

[21] Appl. No.: 09/298,345

[22] Filed: Apr. 23, 1999

[51] Int. Cl.[7] .................................................. H04B 1/04
[52] U.S. Cl. ........................ 455/126; 455/127; 330/291; 375/297
[58] Field of Search ............................ 455/126, 127, 455/63, 114, 296, 311; 375/296, 297; 330/291

[56] References Cited

U.S. PATENT DOCUMENTS 4,042,885  8/1977  Rhodes, Jr. ................................. 330/9
4,553,052  11/1985  Takahashi ................................. 307/494

OTHER PUBLICATIONS

"PCF5078: Power amplifier controller for GSM and PCN systems," Philips Semiconductors Data Sheet, Product Specification, Apr. 12, 1999, pp. 1–19.
"AD8307: Low Cost DC–500 MHz, 92 dB Logarithmic Amplifier," Analog Devices, REV. A, 1999, pp. 1–20.
"AD8309: 5 MHz–500 MHz 100 dB Demodulating Logarithmic Amplifier with Limiter Output," Analog Devices, REV. A, 1999, pp. 1–20.
"AD8313: 0.1 GHz–2.5 GHz, 70 dB Logarithmic Detector/Controller," Analog Devices, REV. A, 1999, pp. 1–16.
"AD8306: 5 MHz–400 MHz 100 dB High Precision Limiting–Logarithmic Amplifier," Analog Devices, REV. 0, 1999, pp. 1–16.
"AD641: 250 MHz Demodulating Logarithmic Amplifier," Analog Devices, REV. B, 1999, pp. 1–16.
"SiGe Front–End RFICs," Microwave Journal, Dec. 1998, pp. 114–116.
"A 0.1 to 2.5 GHz Logarithmic Amplifier for RF Detection," Microwave Journal, Jul. 1998, pp. 142–145.

"PCF5077T: Power amplifier controller for GSM and PCN systems," Philips Semiconductors Data Sheet, Preliminary Specification, Nov. 19, 1997, pp. 1–23.
Williams, Mark et al., "Technique Provides Burst Control in GSM Power Amplifiers," Microwaves & RF, Jul. 1997, pp. 70–78.
Raymond W. Waugh, "Designing Large–Signal Detectors for Handsets and Base Stations," Wireless Systems Design, Jul. 1997, pp. 42–48.
"Driver Amplifier Provides Wide Gain–Control Range," Microwaves & RF, Feb. 1997, p. 140.
"LTC1409: 12–Bit, 800ksps Sampling A/D Converter with Shutdown," 1997 Linear Technology Databook, vol. VI, pp. 6–65–6–84.
Lindberg, Craig et al., "Simplify Bias Voltage Circuits for GaAs Power Amps," Microwaves & RF, Dec. 1995, pp. 155–160.
"PCF5075: Power amplifier controller for GSM and PCN systems," Philips Semiconductors Preliminary Specification, Jul. 19, 1995, pp. 1287–1303.
"AD606: 50MHz, 80 dB Demodulating Logarithmic Amplifier with Limiter Output," Analog Devices, REV. 0, 1994, pp. 20–29–20–39.

Primary Examiner—Nguyen Vo
Attorney, Agent, or Firm—Fish & Neave; Steven J. Cahill

[57] ABSTRACT

The invention provides RF power controllers that cancel offset voltages in the power control loop and external offset voltages by coupling the output of the RF power controller to an auto-zero amplifier during STANDBY mode. The auto-zero amplifier controls the output voltage of the RF power controller during each STANDBY mode so as to eliminate the effect of offset voltages. The voltage at the input of the auto-zero amplifier that allows the offset voltages to be canceled is stored during ENABLE mode. The stored voltage is used by the auto-zero amplifier to continue to remove the effect of the offset voltages on the output voltage of the RF power controller during ENABLE mode. Offset drifts due to temperature, power supply changes, etc. are canceled due to frequent offset sampling.

46 Claims, 4 Drawing Sheets

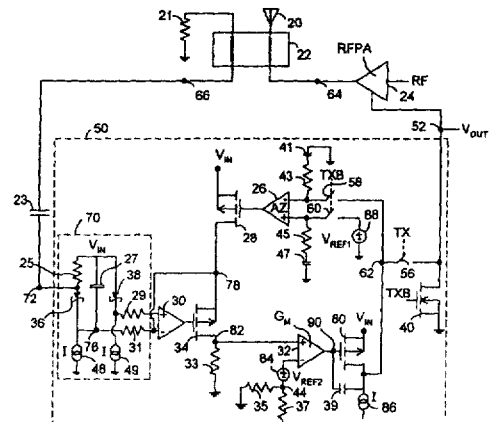

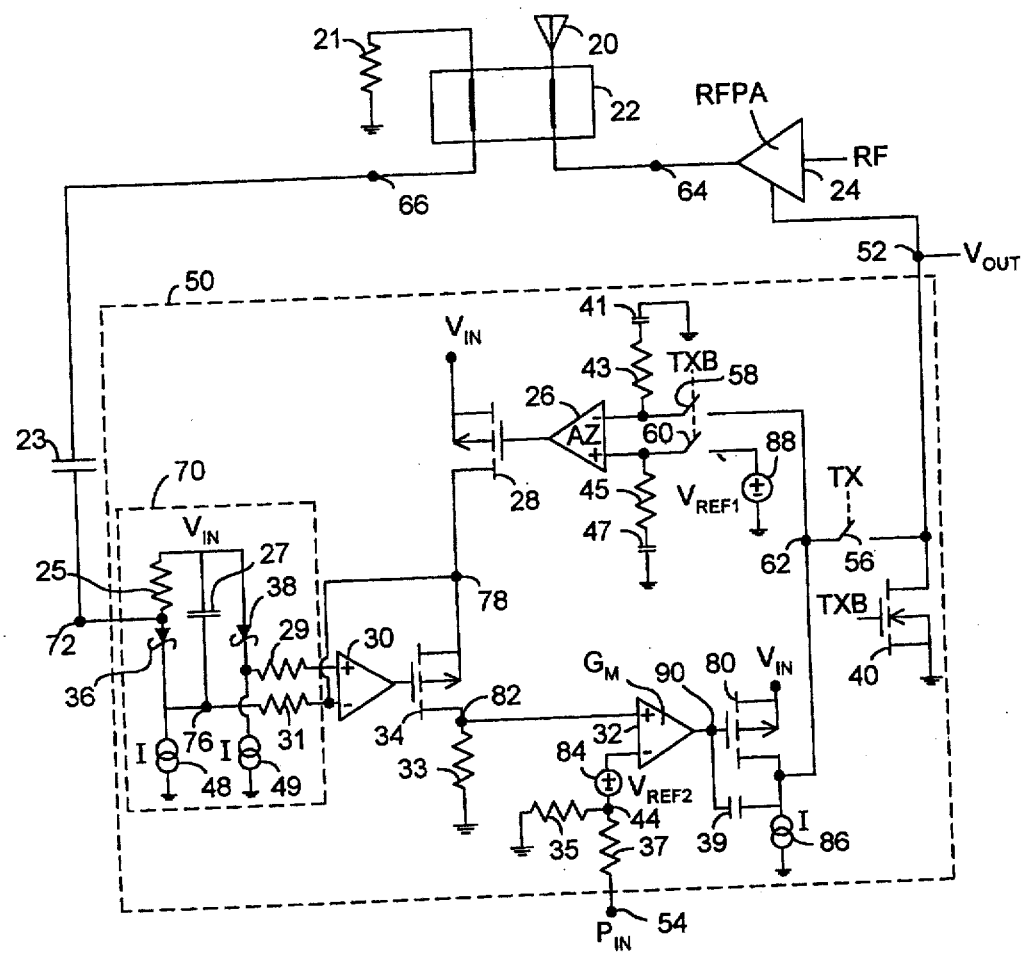

UNITED STATES PATENT AND TRADEMARK OFFICE
CERTIFICATE OF CORRECTION

PATENT NO.    : 6,167,242
DATED         : December 26, 2000
INVENTOR(S)   : Henderson et al.

It is certified that error appears in the above-identified patent and that said Letters Patent is hereby corrected as shown below:

Title page should be deleted to appear as per attached title page.

<u>Drawings,</u>
Sheet 1 of 4, Fig. 2 should be deleted and replaced with attached drawing sheet.

<u>Column 2,</u>
Line 19, replace "poewr" with -- power --.

Signed and Sealed this

Twenty-second Day of April, 2003

JAMES E. ROGAN
*Director of the United States Patent and Trademark Office*

United States Patent [19]
Henderson et al.

[11] Patent Number: 6,167,242
[45] Date of Patent: Dec. 26, 2000

[54] OFFSET VOLTAGE CANCELLATION SYSTEM FOR RADIO FREQUENCY POWER CONTROLLERS

[75] Inventors: Edward L. Henderson, Atkinson, N.H.; David B. Bell, Los Altos, Calif.

[73] Assignee: Linear Technology Corporation, Milpitas, Calif.

[21] Appl. No.: 09/298,345

[22] Filed: Apr. 23, 1999

[51] Int. Cl.[7] .................................................. H04B 1/04
[52] U.S. Cl. ......................... 455/126; 455/127; 330/291; 375/297
[58] Field of Search .................... 455/126, 127, 455/63, 114, 296, 311; 375/296, 297; 330/291

[56] References Cited

U.S. PATENT DOCUMENTS

| | | | |
|---|---|---|---|
| 4,042,885 | 8/1977 | Rhodes, Jr. ................................. | 330/9 |
| 4,553,052 | 11/1985 | Takahashi ................................. | 307/494 |

OTHER PUBLICATIONS

"PCF5078: Power amplifier controller for GSM and PCN systems," Philips Semiconductors Data Sheet, Product Specification, Apr. 12, 1999, pp. 1–19.
"AD8307: Low Cost DC–500 MHz, 92 dB Logarithmic Amplifier," Analog Devices, REV. A, 1999, pp. 1–20.
"AD8309: 5 MHz–500 MHz 100 dB Demodulating Logarithmic Amplifier with Limiter Output," Analog Devices, REV. A, 1999, pp. 1–20.
"AD8313: 0.1 GHz–2.5 GHz, 70 dB Logarithmic Detector/Controller," Analog Devices, REV. A, 1999, pp. 1–16.
"AD8306: 5 MHz–400 MHz 100 dB High Precision Limiting–Logarithmic Amplifier," Analog Devices, REV. 0, 1999, pp. 1–16.
"AD641: 250 MHz Demodulating Logarithmic Amplifier," Analog Devices, REV. B, 1999, pp. 1–16.
"SiGe Front–End RFICs," Microwave Journal, Dec. 1998, pp. 114–116.
"A 0.1 to 2.5 GHz Logarithmic Amplifier for RF Detection," Microwave Journal, Jul. 1998, pp. 142–145.
"PCF5077T: Power amplifier controller for GSM and PCN systems," Philips Semiconductors Data Sheet, Preliminary Specification, Nov. 19, 1997, pp. 1–23.
Williams, Mark et al., "Technique Provides Burst Control in GSM Power Amplifiers," Microwaves & RF, Jul. 1997, pp. 70–78.
Raymond W. Waugh, "Designing Large–Signal Detectors for Handsets and Base Stations," Wireless Systems Design, Jul. 1997, pp. 42–48.
"Driver Amplifier Provides Wide Gain–Control Range," Microwaves & RF, Feb. 1997, p. 140.
"LTC1409: 12–Bit, 800ksps Sampling A/D Converter with Shutdown," 1997 Linear Technology Databook, vol. VI, pp. 6–65–6–84.
Lindberg, Craig et al., "Simplify Bias Voltage Circuits for GaAs Power Amps," Microwaves & RF, Dec. 1995, pp. 155–160.
"PCF5075: Power amplifier controller for GSM and PCN systems," Philips Semiconductors Preliminary Specification, Jul. 19, 1995, pp. 1287–1303.
"AD606: 50MHz, 80 dB Demodulating Logarithmic Amplifier with Limiter Output," Analog Devices, REV. 0, 1994, pp. 20–29–20–39.

*Primary Examiner*—Nguyen Vo
*Attorney, Agent, or Firm*—Fish & Neave; Steven J. Cahill

[57] ABSTRACT

The invention provides RF power controllers that cancel offset voltages in the power control loop and external offset voltages by coupling the output of the RF power controller to an auto-zero amplifier during STANDBY mode. The auto-zero amplifier controls the output voltage of the RF power controller during each STANDBY mode so as to eliminate the effect of offset voltages. The voltage at the input of the auto-zero amplifier that allows the offset voltages to be canceled is stored during ENABLE mode. The stored voltage is used by the auto-zero amplifier to continue to remove the effect of the offset voltages on the output voltage of the RF power controller during ENABLE mode. Offset drifts due to temperature, power supply changes, etc. are canceled due to frequent offset sampling.

46 Claims, 4 Drawing Sheets

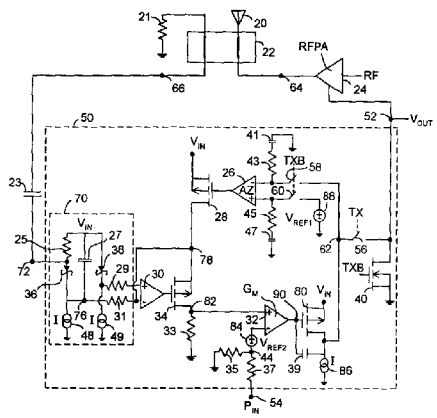

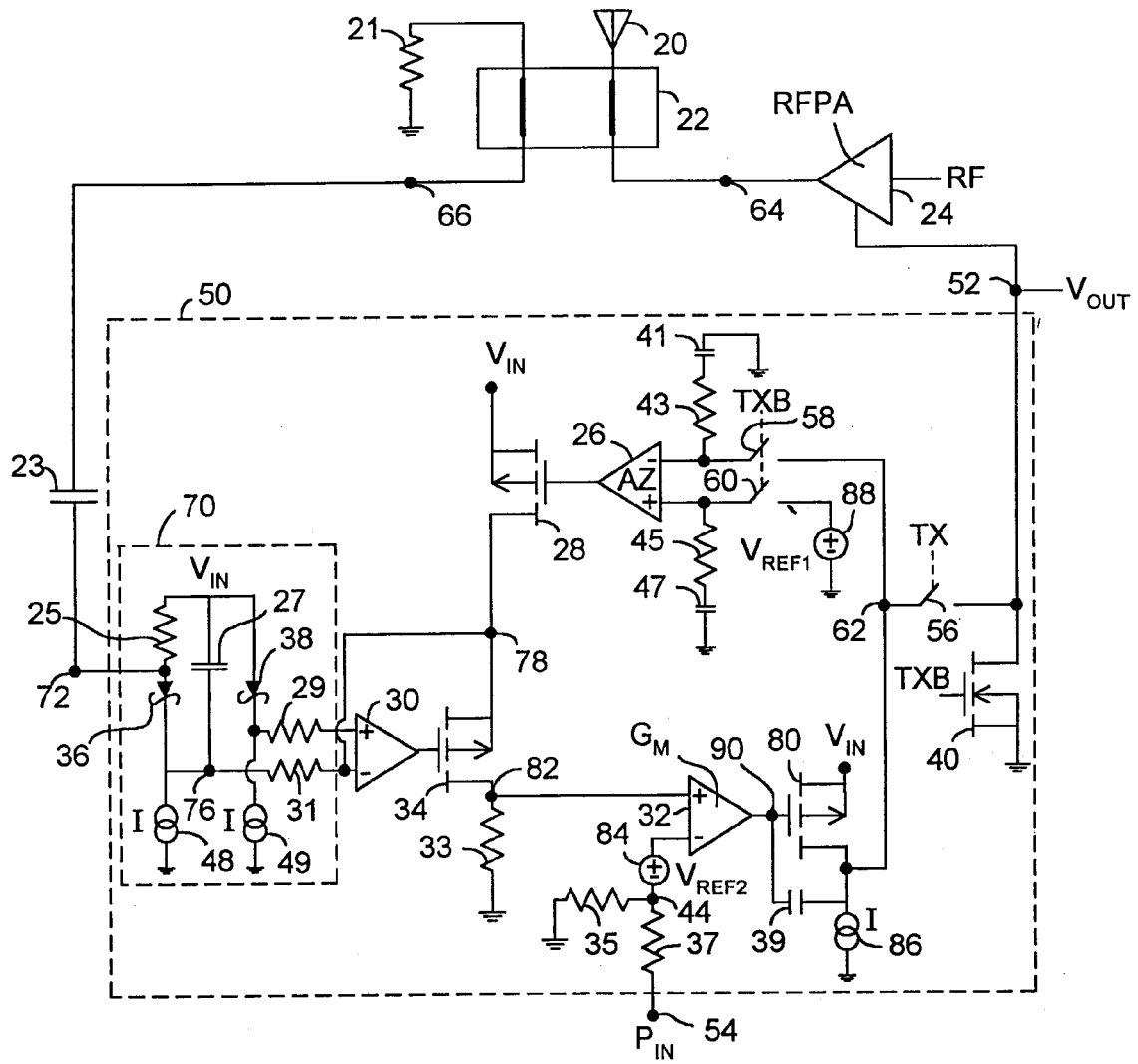

UNITED STATES PATENT AND TRADEMARK OFFICE
CERTIFICATE OF CORRECTION

PATENT NO.    : 6,167,242
DATED         : December 26, 2000
INVENTOR(S)   : Henderson et al.

It is certified that error appears in the above-identified patent and that said Letters Patent is hereby corrected as shown below:

Title page should be deleted to appear as per attached title page.

<u>Drawings,</u>
Sheet 1 of 4, Fig. 1 should be deleted and replaced with attached drawing sheet.

<u>Column 2,</u>
Line 19, replace "poewr" with -- power --.

This certificate supersedes Certificate of Correction issued April 22, 2003.

Signed and Sealed this

Second Day of December, 2003

JAMES E. ROGAN
*Director of the United States Patent and Trademark Office*

United States Patent [19]
Henderson et al.

[11] Patent Number: 6,167,242
[45] Date of Patent: Dec. 26, 2000

[54] OFFSET VOLTAGE CANCELLATION SYSTEM FOR RADIO FREQUENCY POWER CONTROLLERS

[75] Inventors: Edward L. Henderson, Atkinson, N.H.; David B. Bell, Los Altos, Calif.

[73] Assignee: Linear Technology Corporation, Milpitas, Calif.

[21] Appl. No.: 09/298,345

[22] Filed: Apr. 23, 1999

[51] Int. Cl.[7] .................................................... H04B 1/04
[52] U.S. Cl. ........................ 455/126; 455/127; 330/291; 375/297
[58] Field of Search ........................... 455/126, 127, 455/63, 114, 296, 311; 375/296, 297; 330/291

[56] References Cited

U.S. PATENT DOCUMENTS

| | | | |
|---|---|---|---|
| 4,042,885 | 8/1977 | Rhodes, Jr. | 330/9 |
| 4,553,052 | 11/1985 | Takahashi | 307/494 |

OTHER PUBLICATIONS

"PCF5078: Power amplifier controller for GSM and PCN systems," Philips Semiconductors Data Sheet, Product Specification, Apr. 12, 1999, pp. 1–19.
"AD8307: Low Cost DC–500 MHz, 92 dB Logarithmic Amplifier," Analog Devices, REV. A, 1999, pp. 1–20.
"AD8309: 5 MHz–500 MHz 100 dB Demodulating Logarithmic Amplifier with Limiter Output," Analog Devices, REV. A, 1999, pp. 1–20.
"AD8313: 0.1 GHz–2.5 GHz, 70 dB Logarithmic Detector/Controller," Analog Devices, REV. A, 1999, pp. 1–16.
"AD8306: 5 MHz–400 MHz 100 dB High Precision Limiting–Logarithmic Amplifier," Analog Devices, REV. 0, 1999, pp. 1–16.
"AD641: 250 MHz Demodulating Logarithmic Amplifier," Analog Devices, REV. B, 1999, pp. 1–16.
"SiGe Front–End RFICs," Microwave Journal, Dec. 1998, pp. 114–116.
"A 0.1 to 2.5 GHz Logarithmic Amplifier for RF Detection," Microwave Journal, Jul. 1998, pp. 142–145.
"PCF5077T: Power amplifier controller for GSM and PCN systems," Philips Semiconductors Data Sheet, Preliminary Specification, Nov. 19, 1997, pp. 1–23.
Williams, Mark et al., "Technique Provides Burst Control in GSM Power Amplifiers," Microwaves & RF, Jul. 1997, pp. 70–78.
Raymond W. Waugh, "Designing Large–Signal Detectors for Handsets and Base Stations," Wireless Systems Design, Jul. 1997, pp. 42–48.
"Driver Amplifier Provides Wide Gain–Control Range," Microwaves & RF, Feb. 1997, p. 140.
"LTC1409: 12–Bit, 800ksps Sampling A/D Converter with Shutdown," 1997 Linear Technology Databook, vol. VI, pp. 6–65–6–84.
Lindberg, Craig et al., "Simplify Bias Voltage Circuits for GaAs Power Amps," Microwaves & RF, Dec. 1995, pp. 155–160.
"PCF5075: Power amplifier controller for GSM and PCN systems," Philips Semiconductors Preliminary Specification, Jul. 19, 1995, pp. 1287–1303.
"AD606: 50MHz, 80 dB Demodulating Logarithmic Amplifier with Limiter Output," Analog Devices, REV. 0, 1994, pp. 20–29–20–39.

*Primary Examiner*—Nguyen Vo
*Attorney, Agent, or Firm*—Fish & Neave; Steven J. Cahill

[57] ABSTRACT

The invention provides RF power controllers that cancel offset voltages in the power control loop and external offset voltages by coupling the output of the RF power controller to an auto-zero amplifier during STANDBY mode. The auto-zero amplifier controls the output voltage of the RF power controller during each STANDBY mode so as to eliminate the effect of offset voltages. The voltage at the input of the auto-zero amplifier that allows the offset voltages to be canceled is stored during ENABLE mode. The stored voltage is used by the auto-zero amplifier to continue to remove the effect of the offset voltages on the output voltage of the RF power controller during ENABLE mode. Offset drifts due to temperature, power supply changes, etc. are canceled due to frequent offset sampling.

46 Claims, 4 Drawing Sheets